United States Patent
Donolo (10) Patent No.: US 10,473,701 B2
(45) Date of Patent: Nov. 12, 2019

(54) SYSTEMS AND METHODS FOR MAGNETOMETER-BASED CURRENT MEASUREMENT

(71) Applicant: Schweitzer Engineering Laboratories, Inc., Pullman, WA (US)

(72) Inventor: Marcos A. Donolo, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 137 days.

(21) Appl. No.: 15/374,725

(22) Filed: Dec. 9, 2016

(65) Prior Publication Data

US 2018/0164348 A1    Jun. 14, 2018

(51) Int. Cl.
*G01R 1/20* (2006.01)
*G01R 19/25* (2006.01)
*G01R 15/20* (2006.01)

(52) U.S. Cl.
CPC ........ *G01R 19/2513* (2013.01); *G01R 15/207* (2013.01)

(58) Field of Classification Search
CPC .. G01R 15/202; G01R 15/205; G01R 15/207; G01R 15/183; G01R 15/14; G01R 15/20; G01R 19/25; G01R 19/0092; G01R 13/02; G01R 21/08; G01R 11/32; G01R 33/18; G01R 33/02; H01L 41/12; H01L 41/16; H02K 41/06
See application file for complete search history.

(56) References Cited

U.S. PATENT DOCUMENTS

| | | | | |
|---|---|---|---|---|
| 9,389,249 B2* | 7/2016 | Hozumi | ............ | G01R 19/0092 |
| 9,618,541 B1 | 4/2017 | Nguyen et al. | | |
| 9,797,931 B2* | 10/2017 | Takemura | .......... | G01R 19/0092 |
| 2005/0012496 A1* | 1/2005 | Taniguchi | ............ | G01R 31/364 324/117 R |
| 2011/0270553 A1* | 11/2011 | Ausserlechner | ..... | G01R 15/202 702/64 |
| 2012/0290240 A1* | 11/2012 | Fukui | ..................... | G01R 15/20 702/65 |
| 2014/0049255 A1* | 2/2014 | Kitamoto | ............. | G01R 15/207 324/244 |
| 2014/0139203 A1* | 5/2014 | Hozumi | ............. | G01R 19/0092 324/117 R |
| 2015/0212139 A1 | 7/2015 | Smith | | |
| 2017/0184635 A1* | 6/2017 | Ugge | ................... | G01R 15/207 |
| 2017/0248731 A1 | 8/2017 | Bhongale et al. | | |
| 2018/0045763 A1* | 2/2018 | Juds | ..................... | G01R 15/207 |
| 2018/0231588 A1* | 8/2018 | Walker | ................. | G01R 15/202 |

* cited by examiner

*Primary Examiner* — Thang X Le
(74) *Attorney, Agent, or Firm* — Justin K. Flanagan; Bradley W. Schield (57) ABSTRACT

The present disclosure provides systems and methods for utilizing two or more magnetometers for current measurements. The systems and methods may include two or more multi-axis magnetometer sensors to monitor a high-voltage three-phase alternating current (AC) transmission line carrying a current, I. The magnetometers may be positioned at varying distances from the transmission line. The systems and methods may isolate or otherwise account for external magnetic fields, such as the earth's magnetic field, to generate accurate current measurements in a conductor.

28 Claims, 9 Drawing Sheets

SYSTEMS AND METHODS FOR MAGNETOMETER-BASED CURRENT MEASUREMENT

TECHNICAL FIELD

The present disclosure relates generally to measuring current. Specifically, the present disclosure relates to using a plurality of magnetometers for current measurement applications.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

High-voltage three-phase alternating current (AC) transmission lines transmit electrical power via a power grid to consumers. The current flow induces a cylindrical magnetic field around the wire. A magnetometer may be used to determine the current along the line by measuring the magnetic field created by the current.

For instance, a magnetometer may include three or more axis sensors to detect changes in magnitude and orientation of the magnetic field caused by the current flowing through the line. The magnetometer may also include or be operably connected to a processor to calculate the current based on the magnetic field. Thus, a multi-axis magnetometer may be used to measure the current without direct contact with the line.

Magnetometers may have multiple operating modes allowing for a user to select a sampling rate and/or desired error rate threshold. Some applications may only require very low sampling rates, while some high-power relay applications may require a sampling rate of 2000 Hz, or even higher. Using a single magnetometer, including even a single multi-axis magnetometer likely fails to account for external magnetic fields. These magnetic fields may cause the current measurement from the magnetometer to be incorrect. Even if calibrated ahead of time, slight fluctuations in external magnetic fields will likely limit the accuracy of the signal magnetometer and potentially render it useless for a particular application.

Existing technologies do not provide adequate systems or methods for enabling a high sample rate while effectively eliminating background noise by differentiating external magnetic fields from those associated with current. Disclosed herein are systems and methods that utilize multiple magnetometers to increase sampling rates, eliminate external magnetic fields from measurements, and reduce error rates.

A multi-magnetometer system may utilize two or more three-axis magnetometer sensors near each other to resolve existing sampling rate shortcomings. For example, two magnetometer sensors may be located near a conductor at a first location on a transmission line. By way of example, the use of two magnetometers with sampling rates of 800 Hz each may be configured to take alternating samples for a combined sampling rate of 1.6 kHz. This approach allows the multi-magnetometer system to use two or more magnetometer sensors to increase the effective sampling rate.

A multi-magnetometer system may also include two or more three-axis magnetometer sensors located at separate locations along a conductor to eliminate external magnetic fields and reduce error rate. For example, a first magnetometer sensor may be located near the conductor at a first location, and another magnetometer sensor many be located near the conductor at a separate second location some distance away from the first magnetometer sensor. Based on the measured magnetic fields at the first and second locations, the multi-magnetometer system may account for external fields to accurately calculate the current on the conductor.

The multi-magnetometer system may be configured to calculate the current in a variety of systems. For example, the multi-magnetometer system may calculate the current on a high voltage three phase system. Additionally, the multi-magnetometer system may calculate AC and DC currents. Further, the multi-magnetometer system may calculate the current regardless of the voltage level of a conductor.

Embodiments may include various steps, which may be embodied in machine-executable instructions to be executed by a computer system. A computer system may include one or more general-purpose or special-purpose computers (or other electronic devices). The computer system may include hardware components that include specific logic for performing the steps or may include a combination of hardware, software, and/or firmware.

Some of the infrastructure that can be used with embodiments disclosed herein includes: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods. Various modules may be implemented in hardware, software, firmware, and/or a combination thereof.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Additional details and examples are provided with reference to the figures below. The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

Figure 1:
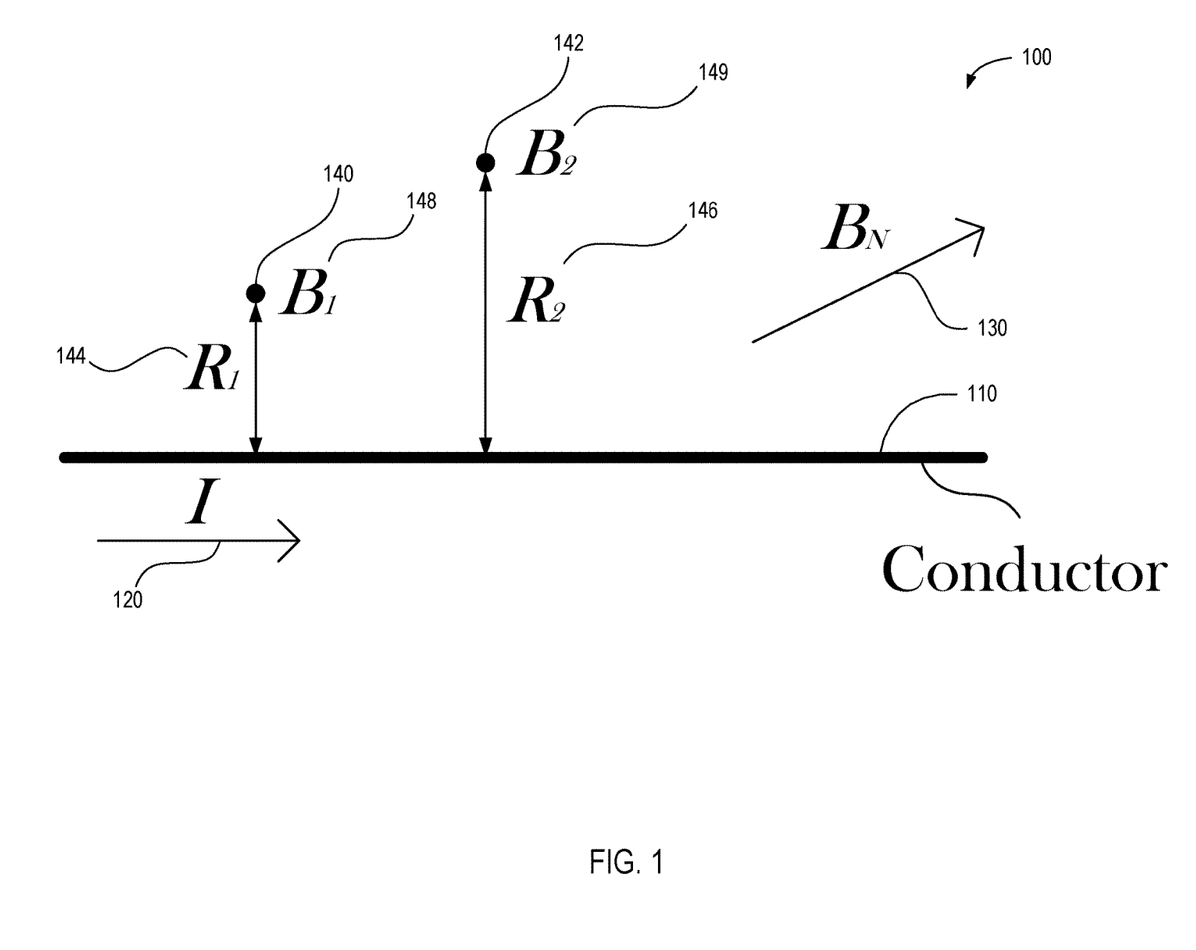
FIG. 1 is a multi-magnetometer system for measuring current on a conductor, according to one embodiment.

FIG. 1 is a multi-magnetometer system 100 for measuring a current, I, 120 on a conductor 110. The multi-magnetometer system 100 may comprise two three-axis magnetometers (140, 142) that measure magnetic fields, $B_1$ 148 and $B_2$ 149. The magnetic fields, $B_1$ 148 and $B_2$ 149, may be used to determine the current 120 on the conductor 110.

The magnetometers 140 and 142 are at distances $R_1$ 144 and $R_2$ 146 from the conductor 110. As shown, the distances $R_1$ 144 and $R_2$ 146 may be different. For example, $R_1$ 144 may be shorter than $R_2$ 146. In some embodiments, the distances $R_1$ 144 and $R_2$ 146 may be equivalent. Both $R_1$ 144 and $R_2$ 146 may be known values, measured values, or deduced values. In some embodiments where the distances $R_1$ 144 and $R_2$ 146 are the same, the multi-magnetometer system 100 may use a least squares algorithm may be used to calculate the current. In embodiments where the distances $R_1$ 144 and $R_2$ 146 are different, the current may be calculated as described below. In some embodiments where the distances $R_1$ 144 and $R_2$ 146 are the same, the multi-magnetometer system 100 may use a pseudo inverse to compute a least squares solution. Additionally, even if the distances $R_1$ 144 and $R_2$ 146 are the same, a full rank matrix may be obtained by having the sensors of the magnetometer 140 and 142 aligned differently from one another.

A constant external magnetic field, $B_N$ 130, may include components $B_{Na}$, $B_{Nb}$ and $B_{Nc}$ in the sensor measuring directions. An external magnetic field may be present as well that originates from one or more other sources, such as the earth's magnetic field and/or other electrical components in the same vicinity. For example, a substation may have a plurality of electrical components that each produce a magnetic field. To accurately calculate the current 120 on one line of the substation, the magnetic fields produced by the other electrical components, and/or the earth's constantly varying magnetic field must be taken into account. To help account for these external magnetic fields, in some embodiments, one axis of the magnetometers 140, 142 with the magnetic field generated by the conductor 110. Alternatively, the external magnetic fields may be accounted for mathematically using known or measured angles of one or more axes of the magnetometers 140, 142 relative to the magnetic field generated of the conductor 110.

In embodiments where at least one of the measurement axis of each of the magnetometers 140, 142 is aligned with the magnetic field created by the current 120, the magnetic field measured by the magnetometers 140, 142 may be written as shown below in Equation 1 and Equation 2.

$$B_1 = \begin{bmatrix} B_{1a} \\ B_{1b} \\ B_{1c} \end{bmatrix} = \frac{\mu_0 I}{2\pi R_1} \begin{bmatrix} 0 \\ 1 \\ 0 \end{bmatrix} + \begin{bmatrix} B_{Na} \\ B_{Nb} \\ B_{Nc} \end{bmatrix} \quad \text{Equation 1}$$

$$B_2 = \begin{bmatrix} B_{2a} \\ B_{2b} \\ B_{2c} \end{bmatrix} = \frac{\mu_0 I}{2\pi R_2} \begin{bmatrix} 0 \\ 1 \\ 0 \end{bmatrix} + \begin{bmatrix} B_{Na} \\ B_{Nb} \\ B_{Nc} \end{bmatrix} \quad \text{Equation 2}$$

Equation 1 and Equation 2 may be combined to generate Equation 3 as shown below.

$$\begin{bmatrix} B_{1a} \\ B_{1b} \\ B_{1c} \\ B_{2a} \\ B_{2b} \\ B_{2c} \end{bmatrix} = \begin{bmatrix} 0 & 1 & 0 & 0 \\ \frac{\mu_0}{2\pi R_1} & 0 & 1 & 0 \\ 0 & 0 & 0 & 1 \\ 0 & 1 & 0 & 0 \\ \frac{\mu_0}{2\pi R_2} & 0 & 1 & 0 \\ 0 & 0 & 0 & 1 \end{bmatrix} \begin{bmatrix} I \\ B_{Na} \\ B_{Nb} \\ B_{Nc} \end{bmatrix} \quad \text{Equation 3}$$

Equation 3 may be solved for the current 120, I. By solving Equation 3, the multi-magnetometer system 100 may distinguish the current 120, I, from the external magnetic field, $B_N$ 130, components. Equation 3 assumes that each of the measurements made by the magnetometer system are taken simultaneously or approximately simultaneously. In other embodiments, the equations may include a time, t, as an additional variable and the measurements may be taken at various times. in such an embodiment, the equation could still be solved for the current 120, I.

In embodiments where the measurement axes of the magnetometers 140, 142 are not aligned with the magnetic field generated by the current 120, the multi-magnetometer system 100 may be configured to account for the angle between the measuring directions and the magnetic field created by the current 120. The multi-magnetometer system 100 may determine the angle by introducing a known current and solving the equations below. In some embodiments, the magnetometers 140, 142 may be aligned with each other. In other embodiments, the magnetometers 140, 142 may not be aligned with each other.

In some embodiments, the multi-magnetometer system 100 may include magnetometers 140, 142 that are aligned with each other. Assuming the two magnetometers 140, 142 are aligned at the same angle relative to the magnetic field created by the current 120, the magnetic fields 148, 149 measured by the magnetometers 140, 142 may be written as shown below in Equations 4 and 5.

$$B_1 = \begin{bmatrix} B_{1a} \\ B_{1b} \\ B_{1c} \end{bmatrix} = \frac{\mu_0 I}{2\pi R_1} \begin{bmatrix} \cos(\alpha) \\ \cos(\beta) \\ \cos(\delta) \end{bmatrix} + \begin{bmatrix} B_{Na} \\ B_{Nb} \\ B_{Nc} \end{bmatrix} \quad \text{Equation 4}$$

$$B_2 = \begin{bmatrix} B_{2a} \\ B_{2b} \\ B_{2c} \end{bmatrix} = \frac{\mu_0 I}{2\pi R_2} \begin{bmatrix} \cos(\alpha) \\ \cos(\beta) \\ \cos(\delta) \end{bmatrix} + \begin{bmatrix} B_{Na} \\ B_{Nb} \\ B_{Nc} \end{bmatrix} \quad \text{Equation 5}$$

Equation 4 and Equation 5 may be combined to generate Equation 6 as shown below.

$$\begin{bmatrix} B_{1a} \\ B_{1b} \\ B_{1c} \\ B_{2a} \\ B_{2b} \\ B_{2c} \end{bmatrix} = \begin{bmatrix} \frac{\mu_0}{2\pi R_1}\cos(\alpha) & 1 & 0 & 0 \\ \frac{\mu_0}{2\pi R_1}\cos(\beta) & 0 & 1 & 0 \\ \frac{\mu_0}{2\pi R_1}\cos(\delta) & 0 & 0 & 1 \\ \frac{\mu_0}{2\pi R_2}\cos(\alpha) & 1 & 0 & 0 \\ \frac{\mu_0}{2\pi R_2}\cos(\beta) & 0 & 1 & 0 \\ \frac{\mu_0}{2\pi R_2}\cos(\delta) & 0 & 0 & 1 \end{bmatrix} \begin{bmatrix} I \\ B_{Na} \\ B_{Nb} \\ B_{Nc} \end{bmatrix} \quad \text{Equation 6}$$

In some embodiments, the angle of the axes of the magnetometers 140, 142 relative to the magnetic field created by the current 120 may be known or measured to obtain $\alpha$, $\beta$, and $\delta$. Alternatively, in some embodiments, the angle may not be known. To determine $\alpha$, $\beta$, and $\delta$, an alignment process may be performed, such as, for example, during an installation, an initialization, or a calibration process. A known current may be applied to the conductor 110. The known current will produce a magnetic field that may be measured by the magnetometers 140, 142. Using Equation 6, the multi-magnetometer system 100 may solve for $\alpha$, $\beta$, and $\delta$. In some embodiments, the multi-magnetometer system 100 may perform this alignment process periodically to ensure accurate current measurements.

In another embodiment, the two magnetometers 140, 142 may not be aligned with the magnetic field and each other. In such an embodiment, the magnetic fields 148, 149 measured by the magnetometers 140, 142 may be expressed as shown below in Equations 7 and 8.

$$B_1 = \begin{bmatrix} B_{1a} \\ B_{1b} \\ B_{1c} \end{bmatrix} = \frac{\mu_0 I}{2\pi R_1} \begin{bmatrix} \cos(\alpha_1) \\ \cos(\beta_1) \\ \cos(\delta_1) \end{bmatrix} + \begin{bmatrix} B_{Na} \\ B_{Nb} \\ B_{Nc} \end{bmatrix} \quad \text{Equation 7}$$

$$B_2 = \begin{bmatrix} B_{2a} \\ B_{2b} \\ B_{2c} \end{bmatrix} = \frac{\mu_0 I}{2\pi R_2} \begin{bmatrix} \cos(\alpha_2) \\ \cos(\beta_2) \\ \cos(\delta_2) \end{bmatrix} + \begin{bmatrix} a11 & a12 & a13 \\ a21 & a22 & a23 \\ a31 & a23 & a33 \end{bmatrix} \begin{bmatrix} B_{Na} \\ B_{Nb} \\ B_{Nc} \end{bmatrix} \quad \text{Equation 8}$$

Where the axes coefficients rotate the axis of the first sensor into alignment with the axis of the second sensor. Equation 7 and Equation 8 may be combined to generate Equation 9 as shown below.

$$\begin{bmatrix} B_{1a} \\ B_{1b} \\ B_{1c} \\ B_{2a} \\ B_{2b} \\ B_{2c} \end{bmatrix} = \begin{bmatrix} \frac{\mu_0}{2\pi R_1}\cos(\alpha_1) & 1 & 0 & 0 \\ \frac{\mu_0}{2\pi R_1}\cos(\beta_1) & 0 & 1 & 0 \\ \frac{\mu_0}{2\pi R_1}\cos(\delta_1) & 0 & 0 & 1 \\ \frac{\mu_0}{2\pi R_2}\cos(\alpha_2) & a11 & a12 & a13 \\ \frac{\mu_0}{2\pi R_2}\cos(\beta_2) & a21 & a22 & a23 \\ \frac{\mu_0}{2\pi R_2}\cos(\delta_2) & a31 & a32 & a33 \end{bmatrix} \begin{bmatrix} I \\ B_{Na} \\ B_{Nb} \\ B_{Nc} \end{bmatrix} \quad \text{Equation 9}$$

In some embodiments, the angles of the magnetometers 140, 142 relative to the magnetic field created by the current 120 may be known or measured to obtain $\alpha_1$, $\alpha_2$, $\beta_1$, $\beta_2$, $\delta_1$, and $\delta_2$. Alternatively, in some embodiments, the angles may not be known. To determine $\alpha_1$, $\alpha_2$, $\beta_1$, $\beta_2$, $\delta_1$, and $\delta_2$, an alignment process may be performed. A known current may be applied to the conductor 110. The known current will produce a magnetic field that may be measured by the magnetometers 140, 142. Using Equation 9, the multi-magnetometer system 100 may solve for $\alpha_1$, $\alpha_2$, $\beta_1$, $\beta_2$, $\delta_1$, and $\delta_2$. Further, the multi-magnetometer system 100 may perform this alignment process periodically to ensure accurate current measurements.

In some embodiments, at least two multi-axis magnetometers may be positioned at first and second distances from a conductor. The multi-axis magnetometers may include at least two axes each to provide at least four measurement values at four different angles to solve for each of the four unknowns: each of the three components of the external fields $B_{Na}$, $B_{Nb}$, and $B_{Nc}$ and the current, I. Such an embodiment may be expressed as provided below in Equation 9.1.

$$\begin{bmatrix} B_{1a} \\ B_{1b} \\ B_{2a} \\ B_{2c} \end{bmatrix} = \begin{bmatrix} \frac{\mu_0}{2\pi R_1}\cos(\alpha_1) & 1 & 0 & 0 \\ \frac{\mu_0}{2\pi R_1}\cos(\beta_1) & 0 & 1 & 0 \\ \frac{\mu_0}{2\pi R_2}\cos(\alpha_2) & 1 & 0 & 0 \\ \frac{\mu_0}{2\pi R_2}\cos(\beta_2) & 0 & 0 & 1 \end{bmatrix} \begin{bmatrix} I \\ B_{Na} \\ B_{Nb} \\ B_{Nc} \end{bmatrix} \quad \text{Equation 9.1}$$

In other embodiments, assuming the external magnetic field is constant or slowly changing, a single three-axis magnetometer may be sufficient. The single three-axis magnetometer may take a plurality of measurement samples over time and utilize a low-pass filter on the output of the sensors to obtain the external magnetic field components $B_{Na}$, $B_{Nb}$, and $B_{Nc}$. In such an embodiment, the magnetic field measurement equation may be simplified as:

$$B_{1b} = \frac{\mu_0 I}{2\pi R_1} + B_{Nb} \qquad \text{Equation 10}$$

Figure 2:
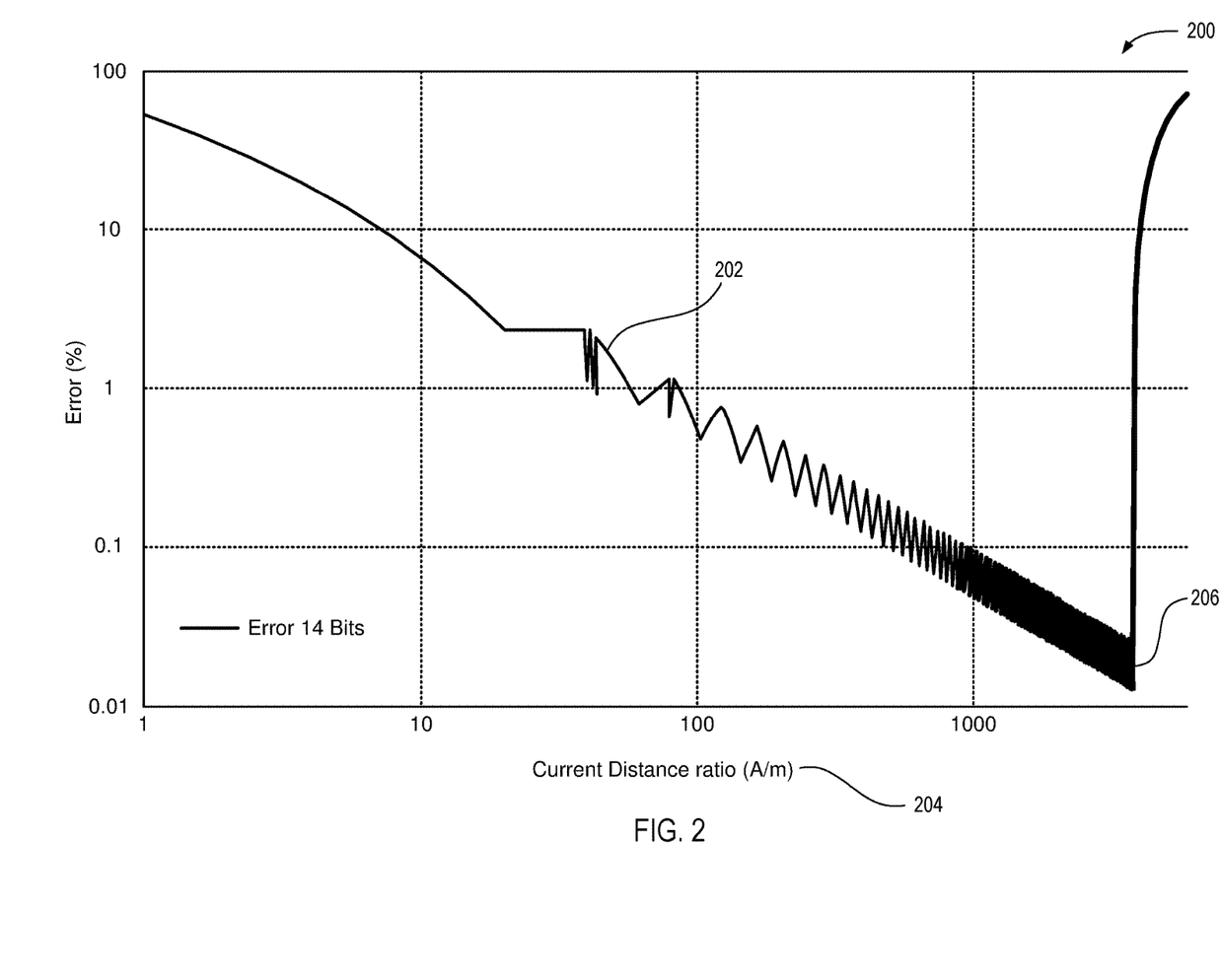
FIG. 2 is a simulation graph depicting a measurement error of a multi-magnetometer system along a current distance ratio.

FIG. 2 illustrates a graph 200 depicting a measurement error 202 of a multi-magnetometer system along a current distance ratio 204. The current distance ratio 204 is illustrated as a ratio of the magnitude of the current over the distance to the magnetometers. The graph 200 illustrates increasing values of the current distance ratio 204 computed with a first magnetometer located at a first position one meters from a conductor, and a second magnetometer located at a second position half a meter from the conductor. The magnetometers in the given simulation were set to a 14-bit mode. As shown, the measurement error 202 decreases as the current distance ratio 204 increases until reaching a saturation point 206. At the saturation point 206, the magnetometer saturates and fails to provide accurate data.

Altering the positon of the sensors relative to the conductor may affect the measurement error 202. For example, if the first magnetometer were placed a distance of $R_1$ from the conductor, the error rate may follow a similar line as the measurement error 202 with the current axis multiplied by $R_1$. For instance, if $R_1=0.1$ meter the 14-bit error may fall below 1% at 9 A/m, whereas if $R_1=1$ meter the 14-bit error may fall below 1% at 90 A/m.

Positioning the magnetometers close to the conductor may improve the sensitivity of the measurement but may lower the saturation point 206. To obtain a target sensitivity, at least one set of magnetometers may be positioned at a calculated distance from the conductor based on the current on the line. However, placing the magnetometer based on the current expected to be on the conductor may limit the measurements of unexpected high currents. This may limit the magnetometer's usefulness in cases of a power surge.

To extend the current measurement range, a second set of magnetometers may be located farther away from the conductor and/or in a manner in which the sensing axes are at an angle to the magnetic field generated by the current. Thus, when the first set of magnetometers is saturated, the second set of magnetometers farther away may be used to measure the current.

In some embodiments a plurality of sets of magnetometers may be spaced at varying distances from the conductor and a multi-magnetometer system may generate a current measurement based on the closest set of magnetometers that are not saturated. For example, three magnetometers may be spaced at 1 meter intervals. The closest two magnetometers may be used for currents below a saturation threshold value corresponding to an expected or actual saturation level of the closest magnetometers. As the current approaches the saturation threshold value, the system may use the middle and farthest magnetometers. In other embodiments, any number of magnetometers may be used (e.g., four, five, six, etc.).

Figure 3:
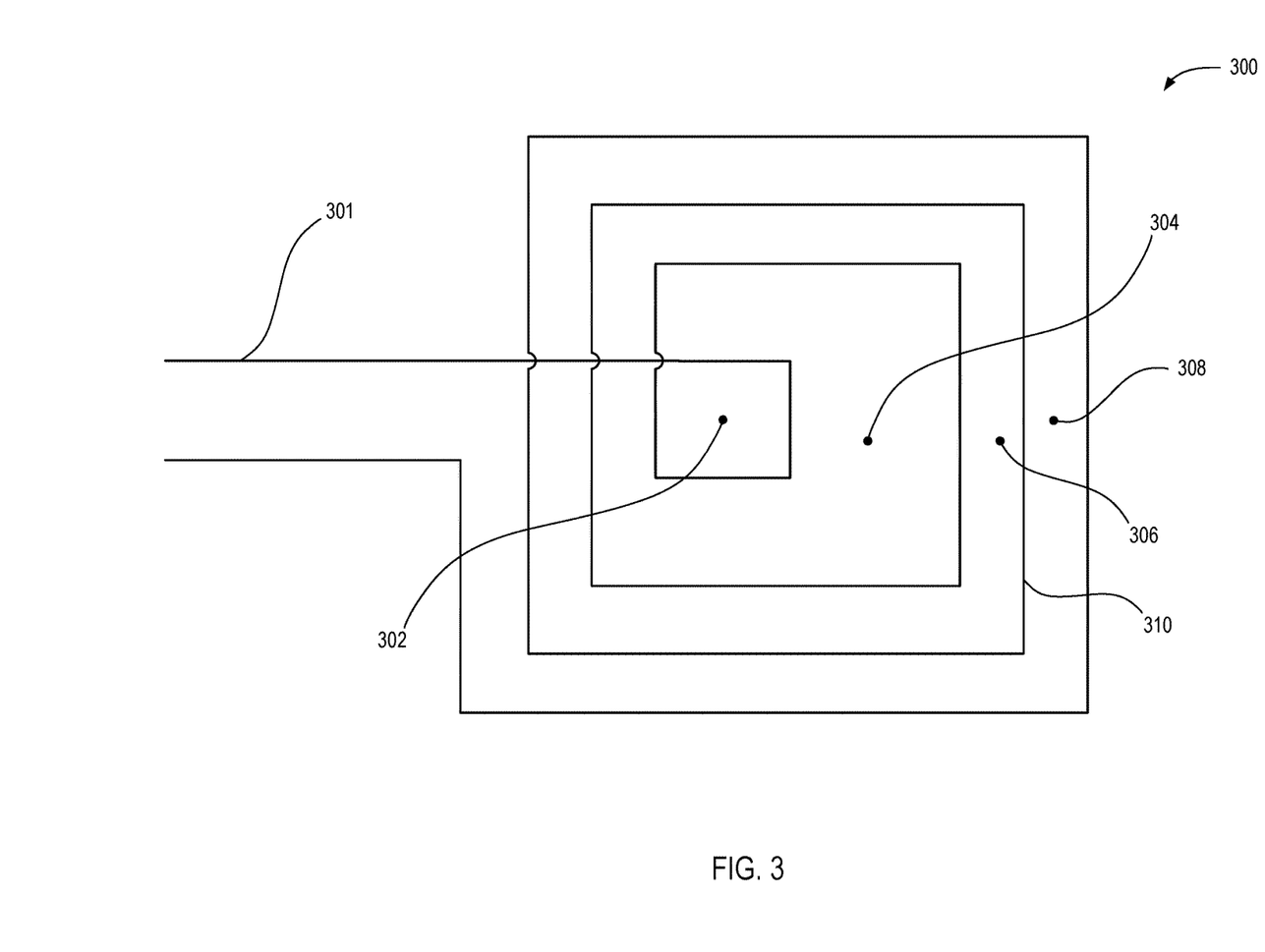
FIG. 3 is a multi-magnetometer system with a set of magnetometers positioned inside a current carrying coil, according to one embodiment.

FIG. 3 is a multi-magnetometer system 300 with a set of magnetometers 302, 304, 306 and 308 positioned at various locations within a coil 310 of conductor 301. The position inside the coil 310 may determine the magnitude of the magnetic fields detected by each magnetometer.

For example, coil 310 has four turns, multiple magnetometers 302, 304, 306 and 308 may be placed within the coil 310. A first magnetometer 302 may be located within the turn of the coil 310 with the smallest diameter. The first magnetometer 302 will detect the magnetic field from all four turns of the coil 310. The second magnetometer 302 may be capable of detecting and determining a very low current because each of the four turns contributes to the inducted magnetic field. A second magnetometer 304 may be positioned outside of the first turn but inside the other three turns. The positioning of the second magnetometer 304 may allow it to detect and determine currents that may saturate the magnetometer 302 because the magnetic field is only inducted by the three turns surrounding the magnetometer 304. This pattern may continue for a third magnetometer 306 and a fourth magnetometer 308. The multi-magnetometer system 300 utilizes the set of magnetometers 302, 304, 306 and 308 placed within each of the turns of the coil 310 to accurately measure a range of currents.

Figure 4:
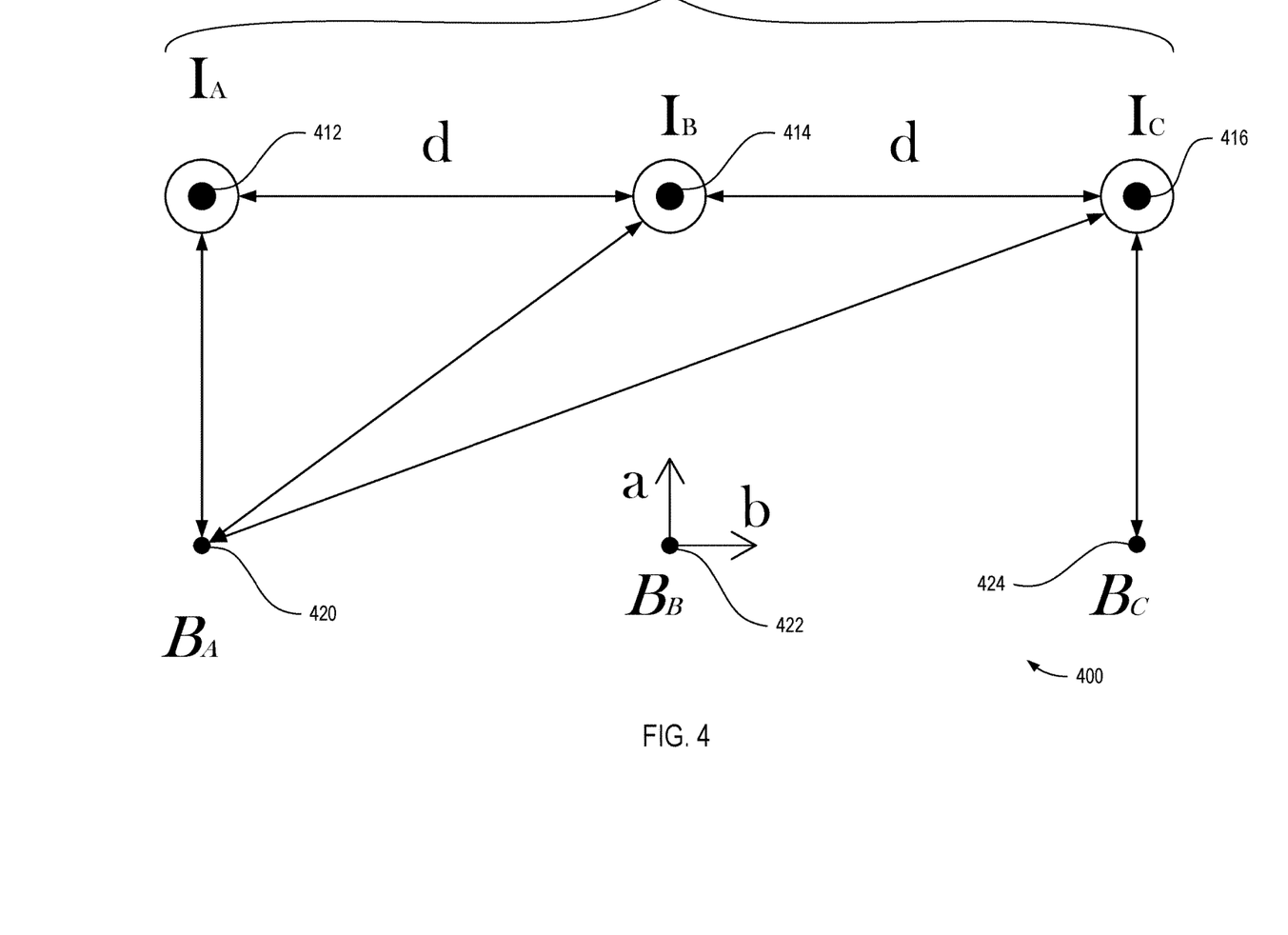
FIG. 4 illustrates a three-sensor multi-magnetometer system for measuring current in a three-phase power system, according to one embodiment.

FIG. 4 illustrates a three-sensor multi-magnetometer system 400 measuring current on a three-phase power distribution system 410, according to one embodiment. As shown, the multi-magnetometer system 400 may include three magnetometers 420, 422, and 424. Each of the magnetometers may be aligned with a different phase conductor (i.e., conductors 412, 414, and 416). For instance, the magnetometer 420 is closest in proximity to the conductor 412.

The magnetometers 420, 422, and 424 may each measure the magnetic fields. Each magnetic field measurement may comprise three components, $b_a$, $b_b$, $b_c$, measured along three different axes of the magnetometers 420, 422, and 424. The multi-magnetometer system 400 may use the measurements to isolate the magnetic fields and calculate a current on each of the lines 412, 414, and 416 using Equation 11.

$$\begin{bmatrix} b_{1a} \\ b_{1b} \\ b_{1c} \\ b_{2a} \\ b_{2b} \\ b_{2c} \\ b_{3a} \\ b_{3b} \\ b_{3c} \end{bmatrix} = \begin{bmatrix} k_{1aA}k_{1aB}k_{1aC} & 1 & 0 & 0 \\ k_{1bA}k_{1bB}k_{1bC} & 0 & 1 & 0 \\ k_{1cA}k_{1cB}k_{1cC} & 0 & 0 & 1 \\ k_{2aA}k_{2aB}k_{2aC} & 1 & 0 & 0 \\ k_{2bA}k_{2bB}k_{2bC} & 0 & 1 & 0 \\ k_{2cA}k_{2cB}k_{2cC} & 0 & 0 & 1 \\ k_{3aA}k_{3aB}k_{3aC} & 1 & 0 & 0 \\ k_{3bA}k_{3bB}k_{3bC} & 0 & 1 & 0 \\ k_{3cA}k_{3cB}k_{3cC} & 0 & 0 & 1 \end{bmatrix} \begin{bmatrix} I_A \\ I_B \\ I_C \\ B_{Na} \\ B_{Nb} \\ B_{Nc} \end{bmatrix} \qquad \text{Equation 11}$$

The first three rows of coefficients of the matrix Equation 11 vary based on the location of the sensor with respect to the conductor. The $k_{xyz}$ matrix coefficients are determined by distance $d(B_x, I_z)$ between the sensor $B_x$, the conductor carrying $I_z$, and the angle between the magnetic field component of $I_z$ in the "Y" of the magnetometer sensor as shown in Equation 12 below.

$$k_{1aA} = \frac{\mu_0 \cos(\alpha_{aI_A})}{2\pi d(B_1, I_A)} \qquad \text{Equation 12}$$

In some embodiments, the distance between the sensor and each conductor may be known. For example, the distances may be measured during installation, or the magnetometers may be housed in a covering that maintains a known distance.

In other embodiments, the multi-magnetometer system may perform a calibration to determine the distances. For example, an operator may apply a known current to the conductors and provide the multi-magnetometer system with the current. The multi-magnetometer system may then calculate the distances using Equation 11.

Figure 5:
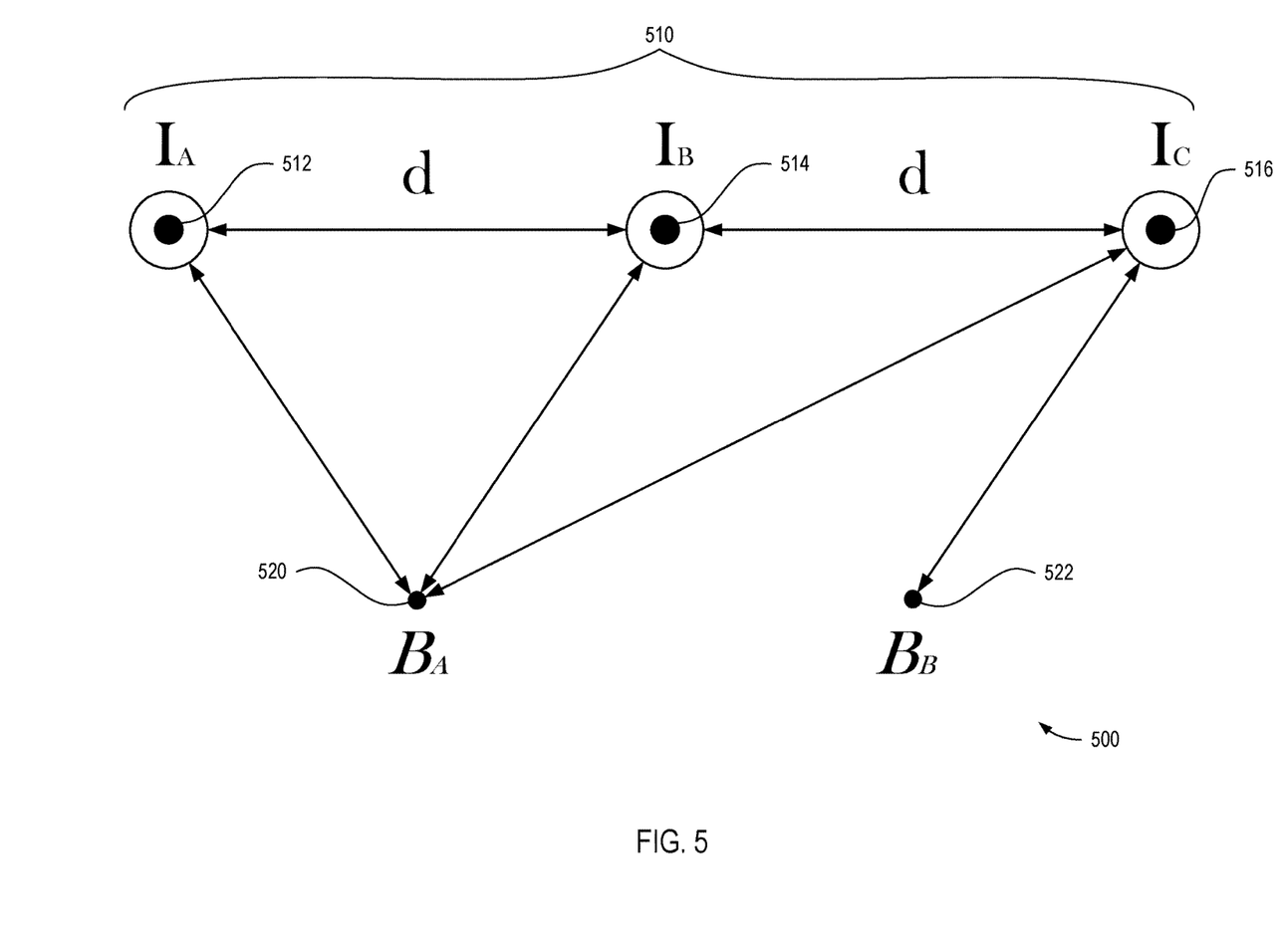
FIG. 5 illustrates a two-sensor multi-magnetometer system for measuring current in a three-phase power line, according to one embodiment.

FIG. 5 illustrates a two-sensor multi-magnetometer system 500 measuring current on a three-phase power system 510, according to one embodiment. As shown, the multi-magnetometer system 500 may include two magnetometers 520 and 522. As shown, the magnetometers 520, 522 may be aligned between two of the conductors (i.e., conductors 512, 514, and 516).

Magnetometers 520, 522 may measure magnetic fields along each of three axes. Thus, each magnetic field measurement may comprise three components, $b_a$, $b_b$, $b_c$, measured along three different axes of the magnetometers 520, 522. The multi-magnetometer system 500 may use the measurements to isolate the magnetic fields and calculate a current on each of the lines 512, 514, and 516 using Equation 13.

$$\begin{bmatrix} b_{1a} \\ b_{1b} \\ b_{1c} \\ b_{2a} \\ b_{2b} \\ b_{2c} \end{bmatrix} = \begin{bmatrix} k_{1aA}k_{1aB}k_{1aC} & 1 & 0 & 0 \\ k_{1bA}k_{1bB}k_{1bC} & 0 & 1 & 0 \\ k_{1cA}k_{1cB}k_{1cC} & 0 & 0 & 1 \\ k_{2aA}k_{2aB}k_{2aC} & 1 & 0 & 0 \\ k_{2bA}k_{2bB}k_{2bC} & 0 & 1 & 0 \\ k_{2cA}k_{2cB}k_{2cC} & 0 & 0 & 1 \end{bmatrix} \begin{bmatrix} I_A \\ I_B \\ I_C \\ B_{Na} \\ B_{Nb} \\ B_{Nc} \end{bmatrix} \quad \text{Equation 13}$$

The first three rows of coefficients of the matrix Equation 13 may be calculated using Equation 12. The distance may be determined as disclosed with reference to the embodiment in FIG. 4.

Figure 6:
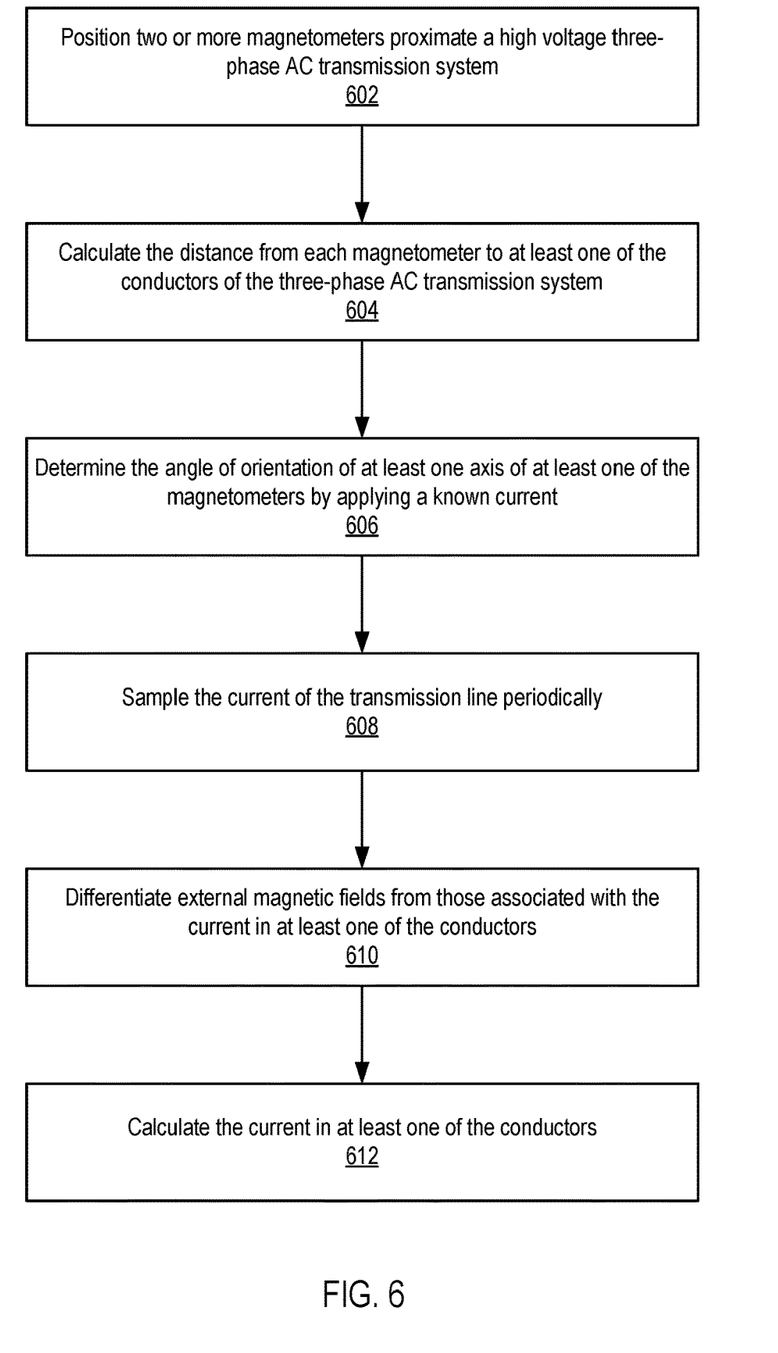
FIG. 6 method is an embodiment of a method for measuring current with two or more magnetometers positioned at varying distances from the conductor.

FIG. 6 is an embodiment of a method for measuring current with two or more magnetometers positioned at varying distances from the conductor. The method may include positioning 602 two or more magnetometers near a high-voltage three-phase AC transmission system. Calculating 604 the distance from each magnetometer to at least one of the conductors of the three-phase AC transmission system. In some embodiments, the distance between each of the magnetometers and the conductors may be calculated by applying a known current to at least one conductor of the three-phase AC transmission system. The method may optionally include determining 606 the angle of orientation of at least one axis of at least one of the magnetometers by applying a known current to at least one conductor of the three-phase AC transmission system. Sampling 608 the current of the transmission line periodically. Differentiating 610 external magnetic fields from those associated with the current in at least one of the conductors of the three-phase AC transmission system. Calculating 618 the current in at least one of the conductors of the three-phase AC transmission system.

Figure 7:
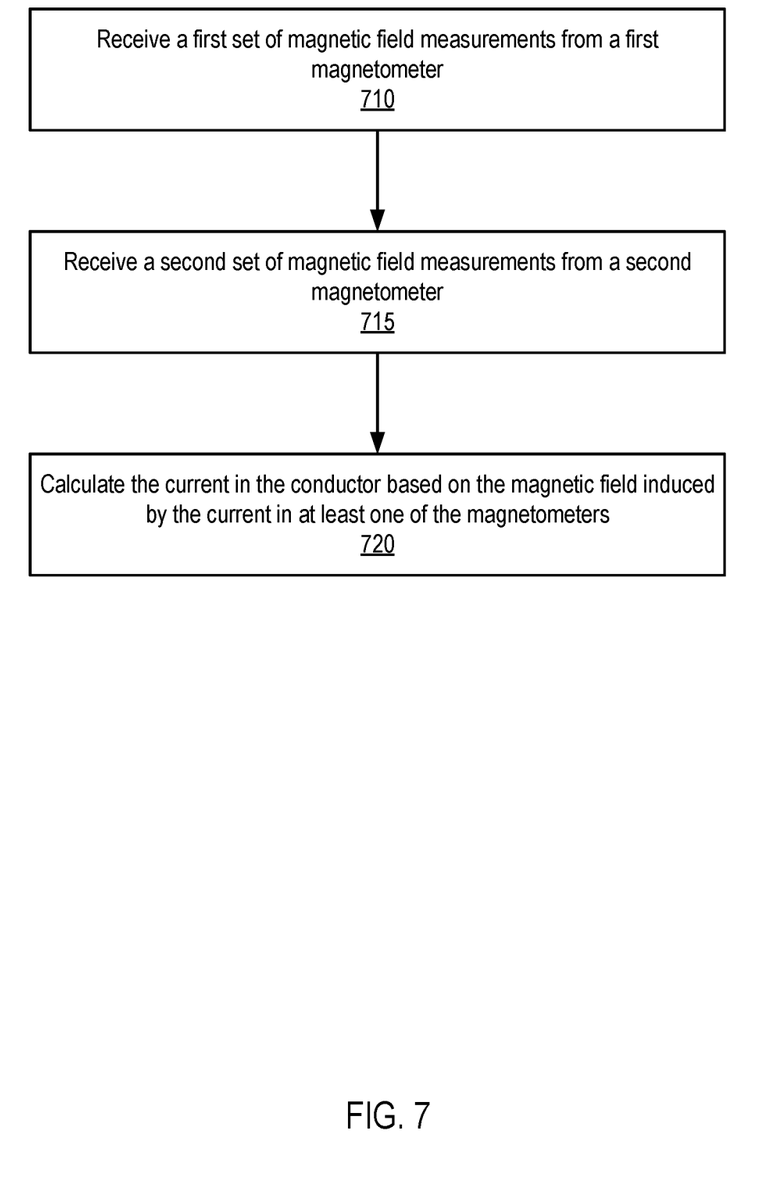
FIG. 7 illustrates a method calculating a current in a conductor, according to one embodiment.

FIG. 7 illustrates a method calculating a current in a conductor, according to one embodiment. A system may receive, 710, a first set of magnetic field measurements from a first magnetometer located a first distance from the conductor.

The system may also receive 715 a second set of magnetic field measurements from a second magnetometer located a second distance from the conductor that is farther from the conductor than the first magnetometer. In various embodiments, the first and second set of magnetic field measurements are sufficient in number and orientation to identify a magnetic field induced by the current in the conductor distinct from background magnetic fields commonly measured by both the first magnetometer and the second magnetometer. For example, four or more measurements may be obtained at three or more orientations. The background magnetic fields commonly measured by both magnetometers may be associated with other electric equipment or components, or even the earth's natural magnetic field.

The system may then calculate 720 the current in the conductor based on the magnetic field induced by the current in at least one of the magnetometers and the distance from the at least one of the magnetometers and the conductor—distinct from external magnetic fields.

Figure 8:
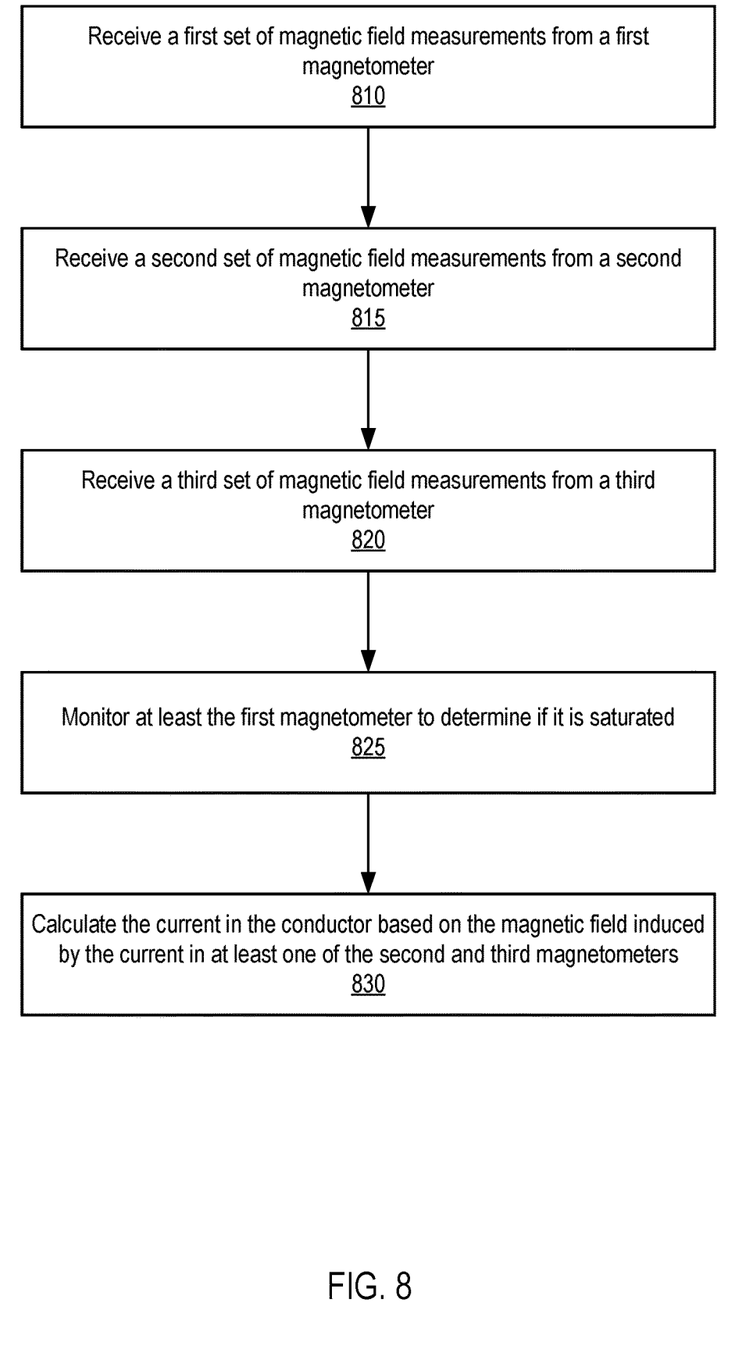
FIG. 8 illustrates another method with some elements similar to that described in conjunction with FIG. 7.

FIG. 8 illustrates another method with some elements similar to that described in conjunction with FIG. 7, including a system to receive 810 a first set of magnetic field measurements from a first magnetometer located a first distance from the conductor. The system may also receive 815 a second set of magnetic field measurements from a second magnetometer located a second distance from the conductor that is farther from the conductor than the first magnetometer.

The system may also receive 820 a third set of magnetic field measurements from a third magnetometer located a third distance from the conductor that is farther from the conductor than the second distance. The system may constantly or periodically monitor the magnetometers to determine 825 that the first magnetometer is saturated. The system may then ignore data from the first magnetometer and calculate 830 the current in the conductor based on the magnetic field induced by the current in at least one of the second and third magnetometers and the distance from the at least one of the second and third magnetometers and the conductor—distinct from the background magnetic fields common to both the second and third magnetometers.

Figure 9:
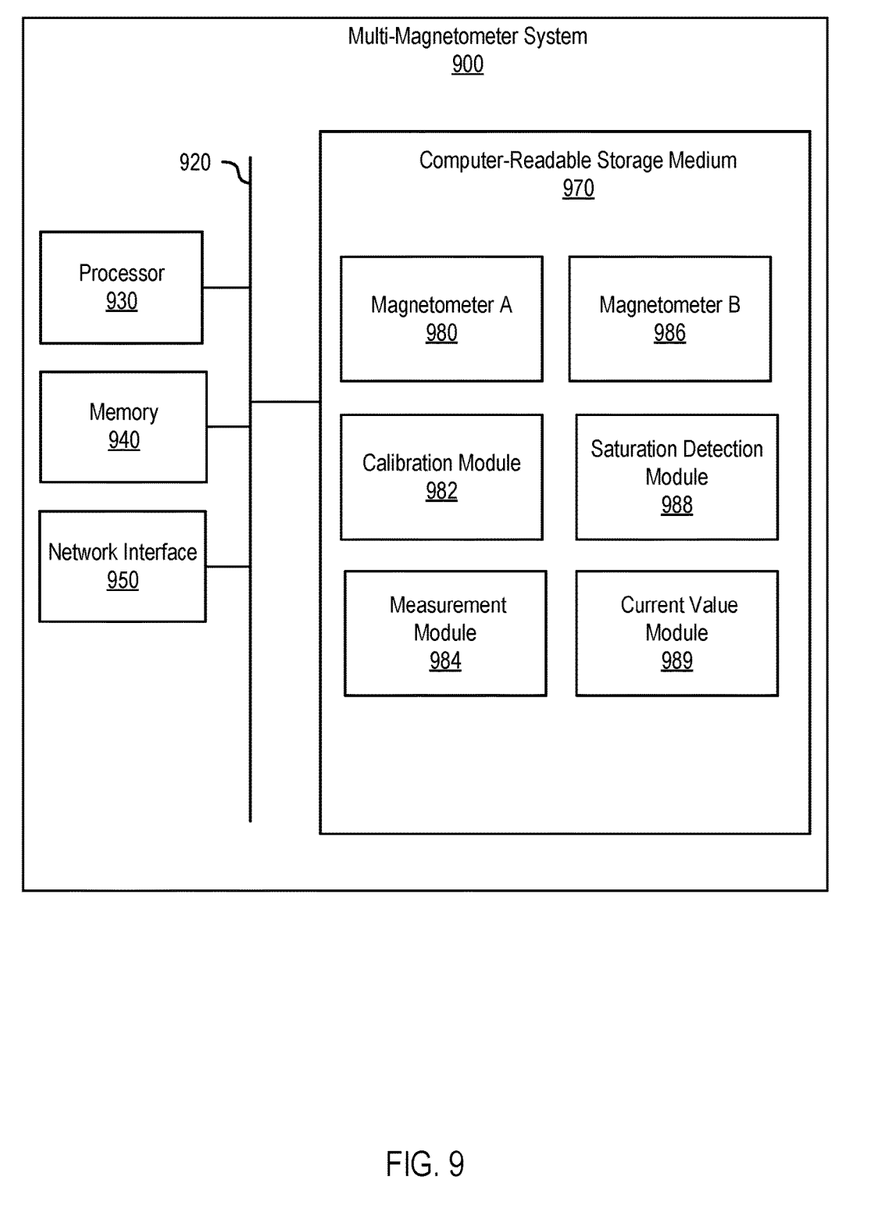
FIG. 9 is a block diagram for a multi-magnetometer system, according to one embodiment.

FIG. 9 is a block diagram for a multi-magnetometer system 900, according to one embodiment. As shown, the multi-magnetometer system 900 may include a bus 920 connecting a processor 930 or processing unit(s) to a memory 940, a network interface 950, and a computer-readable storage medium 970. The computer-readable storage medium 970 may include or interface with software, hardware, and/or firmware modules for implementing various portions of the systems and methods described herein. The separation of the modules is merely an example, and any combination of the modules or further division may be possible.

Two magnetometers 980 and 986 may measure magnetic fields produced by a current on a conductor. In some embodiments, the multi-magnetometer system 900 may include additional magnetometers spaced at varying distances from the conductors. The magnetometers 980, 986 may include two-axis magnetic sensors with an X-axis sensor and a Y-axis sensor. The magnetometers 980, 986 may include additional one or more additional axis, including, for example, a Z-axis sensor. The magnetometer may include various components such as fuses, control logic, and a human machine interface. The magnetometers 980, 986 may also include various components to control and/or generate a timing mechanism. The magnetometers 980, 986 may have various operating modes for different sampling rates.

Many different types and configurations of magnetometers may be used in the various embodiments described herein. As a simple example of a possible embodiment, the magnetometer sensors may be resistors comprising permalloy thin film deposited on a silicon wafer with a strong magnetic field applied to the film to orient its magnetic domains in the same direction. When an external magnetic field is applied perpendicularly to the sides of the film, the magnetization rotates. This rotation causes the film's resistance to vary. According to one embodiment, the change in resistance may be detected as a change in differential voltage. Other possible embodiments, including more complex magnetometer configurations, may be utilized.

A calibration module 982 may be configured to calculate the distance between the magnetometers and a conductor, and the angle of the magnetometers 980, 986 relative to the magnetic field generated by the conductor. For example, a current source may introduce a known current on the line and the calibration module 982 may calculate the angle and distance.

A measurement module 984 may receive measurement values (as analog or digital signals) from each of the multi-axis magnetometers, including at least magnetometers A and B 980 and 986. The measurement module 984 may receive measurements from each axis of each of the multi-axis magnetometers. In some embodiments, a multi-axis magnetometer may include multiple, physically distinct single-axis magnetometer sensors. In other embodiments, a multi-axis magnetometer may include multiple magnetometer sensors in a single package. For example, a multi-axis magnetometer may be manufactured as a three-axis magnetometer with each axis at a ninety degree angle with respect to each of the other two axes, as commonly understood in X-axis, Y-axis, and Z-axis orientations in a Cartesian coordinate system.

A saturation detection module 988 may be configured to identify which unsaturated magnetometer is nearest to the conductor. The magnetometer nearest to the conductor will have the most accurate measurements. However, if the nearest magnetometer is saturated, those measurements are no longer accurate. The saturation detection module 988 therefore identifies the magnetometer(s) with the most accurate measurements based on distance to the conductor and saturation states.

A current value module 989 may be configured to calculate the current on a conductor based on the magnetic fields produced by the current. The current value module 989 may, in some embodiments, be adjusted based on the results of the calibration module 982. Further, the value of the current may be sent via the network interface 950 to an external device such as a monitoring device, a personal electronic device, or a meter.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified.

It will be readily understood that the components of the disclosed embodiments, as generally described and illustrated in the figures herein, could be arranged and designed in a wide variety of different configurations. Thus, the embodiments and methods of the disclosure are not intended to limit the scope of the disclosure, as claimed, but are merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations of the independent and dependent claims.

It will be apparent to those having skill in the art that changes may be made to the details of the above-described embodiments without departing from the underlying principles of the invention.

What is claimed is:

1. A system for calculating a current in a conductor, comprising:
    a first magnetometer configured to be positioned a first distance from the conductor;
    a second magnetometer configured to be positioned a second distance from the conductor that is larger than the first distance;
    a memory;
    a processor operatively coupled to the memory, wherein the processor is configured to execute instructions stored on the memory to cause the processor to:
        receive magnetic field measurements from the first magnetometer and the second magnetometer, wherein the magnetic field measurements comprise magnetic components caused by an external magnetic field from one or more background sources other than the conductor and magnetic components caused by a magnetic field from the current in the conductor; and
        determine the current in the conductor by using at least four of the magnetic field measurements from the first and second magnetometers to account for each magnetic component of the external magnetic field and the magnetic field from the current in the conductor.

2. The system of claim 1, wherein the at least four measurements are in at least three different orientations relative to the conductor.

3. The system of claim 1, wherein the processor is configured to execute instructions stored on the memory to cause the processor to calculate a magnetic field induced by the conductor distinct from background magnetic fields.

4. The system of claim 3, wherein the processor is configured to execute instructions stored on the memory to cause the processor to calculate the current in the conductor based on the calculated magnetic field and the distance from the at least one magnetometer to the conductor.

5. The system of claim 1, wherein each axis of each of the magnetometers comprises a physically distinct, single-axis magnetometer.

6. The system of claim 1, wherein each of the magnetometers comprises a single-packaged multi-axis magnetometer.

7. The system of claim 1, wherein each of the magnetometers comprises a three-axis magnetometer.

8. The system of claim 7, wherein the processor is configured to execute instructions stored on the memory to cause the processor to receive current measurements from each of the three axes of each of the three-axis magnetometers, including six measurements in at least three different orientations relative to the conductor.

9. The system of claim 1, wherein at least one of the magnetometers is located within a coil formed by the conductor.

10. The system of claim 1, wherein the conductor comprises one phase of a three-phase power system.

11. The system of claim 10, wherein the processor is configured to execute instructions stored on the memory to cause the processor to:
receive magnetic field measurements from each of the magnetometers, including at least four measurements in at least three different orientations relative to each phase conductor of the three-phase power system; and
calculate a magnetic field induced by each of the phase conductors distinct from the external magnetic field and the magnetic fields induced by each of the other phase conductors.

12. The system of claim 11, wherein the processor is configured to execute instructions stored on the memory to cause the processor to calculate the current in each of the three conductors in the three-phase power system based on the calculated magnetic field and distance from at least one magnetometer to the conductor, for each respective phase conductor.

13. A non-transitory computer-readable medium comprising instructions that, when executed by a processor, implement operations for calculating a current in a conductor, the operations comprising:
receiving a first set of magnetic field measurements from a first magnetometer located a first distance from the conductor;
receiving a second set of magnetic field measurements from a second magnetometer located a second distance from the conductor that is farther from the conductor than the first magnetometer, wherein the magnetic field measurements comprise magnetic components caused by an external magnetic field from one or more background sources other than the conductor and magnetic components caused by a magnetic field from the current in the conductor; and
determining the current in the conductor by using at least four of the magnetic field measurements from the first and second magnetometers to account for each magnetic component of the external magnetic field included in the first set of magnetic field measurements and the second set of magnetic field measurements.

14. The non-transitory computer-readable medium of claim 13, wherein each of the magnetometers comprises a three-axis magnetometer.

15. The non-transitory computer-readable medium of claim 13, wherein the first and second magnetometers provide four measurements from at least three orientations relative to the conductor.

16. The non-transitory computer-readable medium of claim 13, wherein the operations further comprise:
receiving a third set of magnetic field measurements from a third magnetometer located a third distance from the conductor that is farther from the conductor than the second distance, wherein the second and third set of magnetic field measurements are sufficient in number and orientation to identify a magnetic field induced by the current in the conductor distinct from the external magnetic field commonly measured by both the second magnetometer and the third magnetometer;
determining that the first magnetometer is saturated; and
calculating the current in the conductor based on the magnetic field induced by the current measured by at least one of the second and third magnetometers and a distance from the at least one of the second and third magnetometers and the conductor.

17. A method for calculating a current in a conductor, comprising:
receiving a first set of magnetic field measurements from a first magnetometer located a first distance from a conductor;
receiving a second set of magnetic field measurements from a second magnetometer located a second distance from the conductor that is farther from the conductor than the first magnetometer, wherein the first and second set of magnetic field measurements comprise magnetic components caused by an external magnetic field from one or more background sources other than the conductor and magnetic components caused by a magnetic field from the current in the conductor; and
calculating the current in the conductor based on the first and second set of magnetic field measurements sufficient in number and orientation to account for each magnetic component of the external magnetic field included in the first set of magnetic field measurements and the second set of magnetic field measurements.

18. The method of claim 17, wherein each of the magnetometers comprises a two-axis magnetometer, and wherein the first and second magnetometers provide four measurements from at least three orientations relative to the conductor.

19. The method of claim 17, wherein each of the magnetometers comprises a three-axis magnetometer, and wherein the first and second magnetometers provide six measurements from at least three orientations relative to the conductor.

20. The method of claim 17, wherein the operations further comprise:
receiving a third set of magnetic field measurement from a third magnetometer located a third distance from the conductor that is farther from the conductor than the second distance, wherein the second and third set of magnetic field measurements are sufficient in number and orientation to identify the magnetic field induced by the current in the conductor distinct from the external magnetic field commonly measured by both the second magnetometer and the third magnetometer;
determining that the first magnetometer is saturated; and
calculating the current in the conductor based on the magnetic field induced by the current measured by at least one of the second and third magnetometers and a distance from the at least one of the second and third magnetometers and the conductor.

21. The method of claim 17, wherein at least one axis of each of the magnetometers is aligned with the respect to the conductor.

22. A system for calculating a current in a conductor, comprising:
a first magnetometer configured to be positioned a target distance from the conductor;

a second magnetometer configured to be positioned at the target distance from the conductor;

a measurement value module configured to receive magnetic field measurements from each of the magnetometers, including at least four measurements at different angles relative to the conductor, wherein the magnetic field measurements comprise components caused by a background magnetic field from at least one source other than the conductor; and a current value module to calculate a current in the conductor by using the different angles of the at least four measurements to account for each component of the background magnetic field.

23. The system of claim 22, wherein the current is calculated using a least squares method.

24. The system of claim 22, wherein the current is calculated using a pseudo inverse to compute a least squares solution.

25. The system of claim 22, wherein the first magnetometer and the second magnetometer are multi-axis magnetometers and are aligned differently relative to each other.

26. A system for measuring a magnetic field induced by a current in a conductor, comprising:

a first magnetometer configured to be positioned a first distance from the conductor;

a second magnetometer configured to be positioned a second distance from the conductor;

a measurement value module configured to receive magnetic field measurements from each of the magnetometers, including at least four measurements, wherein the magnetic field measurements comprise magnetic components caused by an external magnetic field from one or more background sources other than the conductor and magnetic components caused by a magnetic field from the current in the conductor; and a current value module configured to calculate a magnetic field induced by the conductor distinct from the external magnetic field by using at least four of the magnetic field measurements to account for each magnetic component of the external magnetic field.

27. The system of claim 26, wherein the first distance is approximately equal to the second distance.

28. The system of claim 26, wherein the first distance is less than the second distance.

* * * * *